(12) United States Patent
Hata

(10) Patent No.: US 9,202,772 B2
(45) Date of Patent: Dec. 1, 2015

(54) HEAT PIPE IN OVERMOLDED FLIP CHIP PACKAGE

(71) Applicant: Altera Corporation, San Jose, CA (US)

(72) Inventor: William Y. Hata, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 155 days.

(21) Appl. No.: 13/781,278

(22) Filed: Feb. 28, 2013

(65) Prior Publication Data

US 2014/0239487 A1 Aug. 28, 2014

(51) Int. Cl.
*H01L 21/00* (2006.01)
*H01L 23/427* (2006.01)
*H01L 21/48* (2006.01)

(52) U.S. Cl.
CPC .......... *H01L 23/427* (2013.01); *H01L 21/4882* (2013.01); *H01L 2224/13* (2013.01); *H01L 2924/0002* (2013.01)

(58) Field of Classification Search
CPC .............. H01L 23/427; H01L 21/4882; H01L 2224/13; H01L 2924/0002
See application file for complete search history.

(56) References Cited

U.S. PATENT DOCUMENTS

| | | | |
|---|---|---|---|
| 5,780,928 A * | 7/1998 | Rostoker et al. | 257/713 |
| 8,617,913 B2 * | 12/2013 | Lower et al. | 438/57 |
| 8,637,980 B1 * | 1/2014 | Lower et al. | 257/713 |
| 2005/0127500 A1 * | 6/2005 | Colgan et al. | 257/706 |
| 2007/0229103 A1 * | 10/2007 | Tani | 324/755 |
| 2007/0231560 A1 * | 10/2007 | Zhang et al. | 428/323 |
| 2008/0019097 A1 * | 1/2008 | Zhang et al. | 361/704 |
| 2008/0253085 A1 * | 10/2008 | Soffer | 361/687 |
| 2009/0068474 A1 * | 3/2009 | Lower et al. | 428/433 |
| 2009/0262290 A1 * | 10/2009 | Sampica et al. | 349/122 |
| 2010/0230805 A1 * | 9/2010 | Refai-Ahmed | 257/712 |
| 2011/0024892 A1 * | 2/2011 | Lin et al. | 257/690 |
| 2014/0015106 A1 * | 1/2014 | Hsieh et al. | 257/618 |
| 2014/0102776 A1 * | 4/2014 | Lower et al. | 174/258 |
| 2014/0239487 A1 * | 8/2014 | Hata | 257/715 |

FOREIGN PATENT DOCUMENTS

JP 11233698 A * 8/1999 ............ H01L 23/427

* cited by examiner

*Primary Examiner* — Laura Menz
(74) *Attorney, Agent, or Firm* — Ward & Zinna, LLC

(57) ABSTRACT

The present invention is an improvement in a molded semiconductor package and the method for its manufacture. The package comprises a substrate, a semiconductor die mounted on the substrate, a molding compound encircling the die on the substrate, a lid on the molding compound, and a heat pipe extending between the semiconductor die and the lid. Preferably, the heat pipe is formed so that it encircles the die. The package is assembled by mounting the die on the substrate, applying the molding compound to the substrate while a channel is formed in the molding compound adjacent the semiconductor die, inserting a heat pipe material in the channel, and mounting the lid on the molding compound and the heat pipe material.

19 Claims, 2 Drawing Sheets

HEAT PIPE IN OVERMOLDED FLIP CHIP PACKAGE

BACKGROUND

This relates to semiconductor packages and their manufacture and, in particular, to improvements in dissipation of heat from semiconductor devices in such packages.

The dissipation of heat generated during the operation of semiconductor devices is a major concern to developers at all levels of integration of such devices. Even the tiniest improvements are of considerable value, in part, because of the large numbers of semiconductor devices that are found in the typical products that use them.

SUMMARY

The present invention is an improvement in a molded semiconductor package and the method for its manufacture. The package comprises a substrate, a semiconductor die mounted on the substrate, a molding compound encircling the die on the substrate, a lid on the molding compound, and a heat pipe extending between the semiconductor die and the lid. Preferably, the heat pipe is formed so that it encircles the die.

The package is assembled by mounting the die on the substrate, applying the molding compound to the substrate while a channel is formed in the molding compound adjacent the semiconductor die, inserting a heat pipe material in the channel, and mounting the lid on the molding compound and the heat pipe material.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
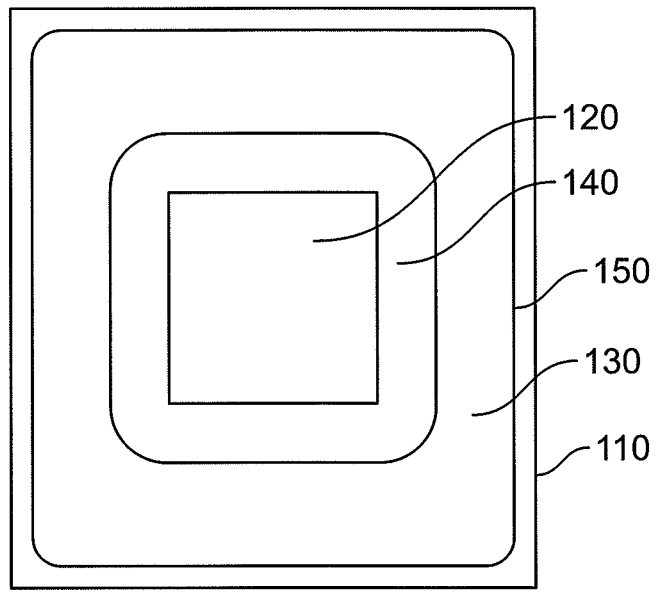
FIG. 1 is a top view of an illustrative embodiment of the invention.
Figure 2:
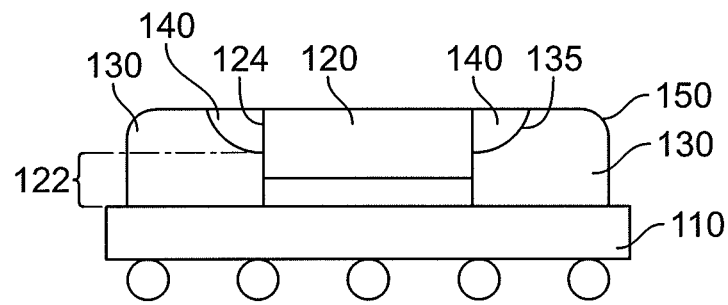
FIG. 2 is a side view of one version of the embodiment of FIG. 1.

FIG. 1 is a top view of an illustrative embodiment of a semiconductor package 100 of the present invention with its lid removed; and FIG. 2 is a side view of the same package with its lid in place. Package 100 comprises a substrate 110, a semiconductor die 120 mounted on the substrate, a molding compound 130 encircling the die on the substrate and contacting a lower part 122 of the die, a heat pipe 140 encircling and contacting an upper part 124 of the die, and a lid 150 (shown in FIG. 2). Lid 150 is secured to substrate 110 and defines an interior region in which die 120, molding compound 130, and heat pipe 140 are located. Molding compound 130 forms a seal with both lid 150 and lower part 122 of die 120 so as to seal off heat pipe 140 between die 120 and lid 150.

As best shown in the side view of FIG. 2, heat pipe 140 is formed in a channel 135 in molding compound 130 that is bounded on one side by semiconductor die 120. As shown in the top view of FIG. 1, channel 135 and heat pipe 140 preferably encircle semiconductor die 110, so that heat pipe 140 contacts all sides of the die on its upper part 124.

Substrate 110, die 120, molding material 130, and lid 150 are conventional. Substrate 110 is typically a molded plastic that provides mechanical support for the die. A plurality of metal layers are formed in the plastic and on the major surfaces of the substrate to provide electrical connection between the die and solder balls or solder bumps on the outside of the package. Semiconductor die 120 is typically made of Silicon but may be made of other semiconductor materials such as Germanium or various semiconductor compounds. The die is ordinarily rectangular in shape having been separated (or singulated) from a rectangular array of identical dies formed in a wafer of semiconductor material. The die is made so that numerous integrated circuits are formed in one major surface of the die which is frequently referred to as the active or front side surface of the die. In FIG. 2, the front side active surface is identified as element 125; and as shown in FIG. 2, the die is typically mounted on the substrate with the front side active surface 125 facing the substrate.

Various molding compounds may be used in the practice of the invention. Some examples are biphenyl epoxy resin and cresol novolac resin. Lid 150 preferably is made of a heat conducting material such as a metal.

With some molding compounds, channel 135 is formed as a trough that develops on the periphery of upper part 124 of die 120 as the molding compound cures. If this trough is not suitable for use for heat pipe 140 or is not available, various methods may he used to form channel 135 in the molding compound. In general, some type of pre-form in the desired shape of the channel may be secured to upper part 124 of die 120 while the molding compound is being applied around the die and may then be removed when the molding compound has cured enough to retain its final shape.

A wide variety of materials are available for use in heat pipe 140. In basic operation, the heat pipe material absorbs heat at upper part 124 of die 120, it is transported to lid 150 where it gives up heat to the cooler surface of the lid; and the material is transported back to the die where the process repeats itself indefinitely. Non-toxic liquids that vaporize at a first temperature below the operating temperature of the die but above the ambient temperature of package 100 and re-liquefy at a second temperature at or above ambient temperature are suitable candidates for heat pipe materials. Specific examples of suitable phase change materials that will function in this way at typical operating temperatures of semiconductor dies are mixtures of ammonia, methanol and water. Such mixtures may be combined with a porous filler or porous mesh and inserted into channel 135.

Figure 3:
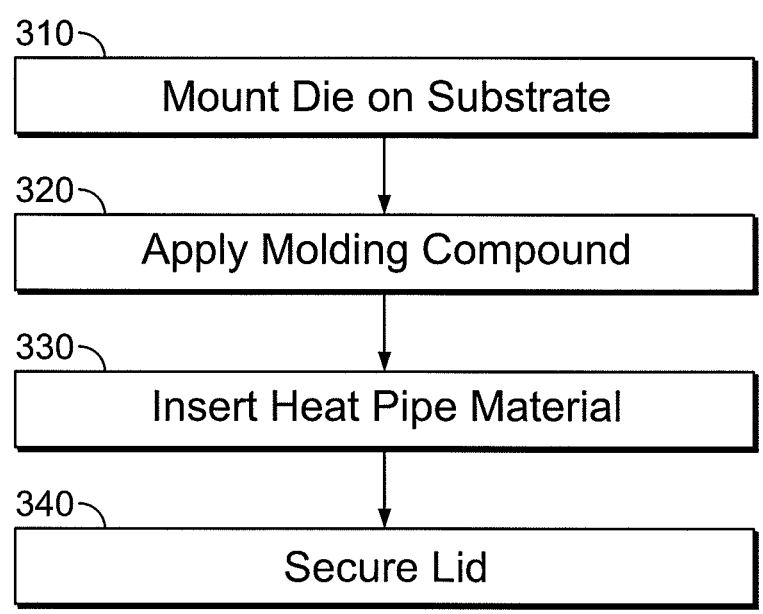
FIG. 3 is a flowchart depicting illustrative steps for forming the embodiments of FIGS. 1-2.

FIG. 3 is a flowchart depicting illustrative steps in making the package 100 of FIGS. 1-2. The package is assembled by mounting the die on the substrate at step 310, applying the molding compound to the substrate and the die while channel 135 is formed at step 320, inserting heat pipe material in channel 135 at step 330, and mounting lid 150 on the heat pipe and molding compound at step 340.

As will be apparent to those skilled in the art, numerous variations may be practiced within the spirit and scope of the present invention. For example, various other materials will be evident that are suitable for use as heat pipe materials

What is claimed is:
1. A structure comprising:
a substrate,
a semiconductor die mounted on the substrate;
a molding material encircling the semiconductor die;
a lid on the molding material,
a heat pipe extending between the semiconductor die and the lid in a channel in the molding material; and
wherein the channel encircles the semiconductor die and the heat pipe contacts the lid and encircles and contacts an upper part of all sides of the semiconductor die.

2. The structure of claim 1 wherein the semiconductor die is rectangular having four sides and the heat pipe extends between an upper part of each side of the die and the lid.

3. The structure of claim 1 wherein the lid is a heat conductor.

4. The structure of claim 1 wherein the lid is secured to the substrate.

5. The structure of claim 1 wherein the lid is shaped to surround the die, molding material and heat pipe.

6. The structure of claim 1 wherein the molding material is a biphenyl epoxy resin or a cresol novolac resin.

7. The structure of claim 1 wherein the heat pipe comprises a mixture of ammonia, methanol and water.

8. A structure comprising:
a substrate;
a lid secured to the substrate and defining an interior region between the substrate and the lid;
a semiconductor die mounted on the substrate within the interior region;
a molding material in the interior region that contacts the substrate, the lid and a lower part of the semiconductor die; and
a heat pipe contacting an upper part of the semiconductor die and an interior surface of the lid.

9. The structure of claim 8 wherein the heat pipe is annular in shape and extends between all sides of the semiconductor die and the lid.

10. The structure of claim 8 wherein the semiconductor die is rectangular and the heat pipe is rectangular in shape and extends between each side of the die and the lid.

11. The structure of claim 8 wherein the lid is a heat conductor.

12. The structure of claim 8 wherein the molding material is a biphenyl epoxy resin or a cresol novolac resin.

13. The structure of claim 8 wherein the heat pipe comprises a mixture of ammonia, methanol and water.

14. A structure comprising:
a substrate;
a lid secured to the substrate and defining an interior region between the substrate and the lid;
a semiconductor die mounted on the substrate within the interior region;
a molding material encircling the semiconductor die in the interior region and contacting a lower part of the semiconductor die; and
a heat pipe encircling the semiconductor die and contacting an upper part of the semiconductor die and an interior surface of the lid.

15. The structure of claim 14 wherein the heat pipe is annular in shape and extends between all sides of the semiconductor die and the lid.

16. The structure of claim 14 wherein the semiconductor die is mounted on the substrate with its front surface facing the substrate.

17. The structure of claim 14 wherein the lid is a heat conductor.

18. The structure of claim 14 wherein the molding material is a biphenyl epoxy resin or a cresol novolac resin.

19. The structure of claim 14 wherein the heat pipe comprises a mixture of ammonia, methanol and water.

\* \* \* \* \*